United States Patent [19]

Takagi et al.

[11] 4,293,589

[45] Oct. 6, 1981

[54] PROCESS FOR HIGH PRESSURE OXIDATION OF SILICON

[75] Inventors: Mikio Takagi; Mamoru Maeda, both of Kawasaki; Hajime Kamioka, Yokohama, all of Japan

[73] Assignee: Fujitsu Limited, Kawasaki, Japan

[21] Appl. No.: 192,812

[22] Filed: Oct. 1, 1980

Related U.S. Application Data

[62] Division of Ser. No. 955,755, Oct. 30, 1978.

[30] Foreign Application Priority Data

Oct. 31, 1977 [JP] Japan ................................ 52-130651
Oct. 31, 1977 [JP] Japan ................................ 52-130652
Oct. 31, 1977 [JP] Japan ................................ 52-130653

[51] Int. Cl.$^3$ ............................................ H01L 2/316
[52] U.S. Cl. ............................................. 427/93; 65/36; 118/733; 422/295; 427/255; 427/255.1; 427/255.4; 427/294; 357/23
[58] Field of Search .................... 427/255.1, 93, 255, 427/255.4, 294; 65/36; 118/733; 422/295

[56] References Cited

U.S. PATENT DOCUMENTS

| | | | |
|---|---|---|---|
| 3,047,438 | 7/1962 | Marinace | 427/93 |
| 3,526,205 | 9/1970 | Rosenheinrich | 118/49 |
| 3,984,267 | 10/1976 | Craford | 427/93 |
| 4,002,512 | 1/1977 | Lim | 427/93 |
| 4,139,658 | 2/1979 | Cohen | 427/93 |
| 4,167,915 | 9/1979 | Toole et al. | 427/93 |

OTHER PUBLICATIONS

Tsubouchi N. et al., "Oxidation of Silicon in High Pressure Steam", Japan J. Appl. Phys., vol. 16, No. 5 (1977).
Panousis, "High Pressure Steam Apparatus for the Accelerated Oxidation of Silicon", Abstract No. 53, Spring Meeting of Electrochemical Soc., May 1973.
Chamberlin et al., *IBM Tech. Dis. Bull.*, "Diffusion using . . . Source", vol. 6, No. 1, p. 114 (1963).
Zeto et al., *J. Electrochemical Soc.*, "Low Temp. . . . 1ATM", vol. 122, No. 10, pp. 1409–1410 (10–1975).
Ligenza, *J. Electrochemical Soc.*, "Oxidation . . . Steam", vol. 109, No. 2, pp. 73–76 (1962).
Powell, "Selective . . . Steam", *IEEE Trans. Electron Devices*, vol. Ed.-21, pp. 636–640 (10–1974).

*Primary Examiner*—John D. Smith
*Attorney, Agent, or Firm*—Staas & Halsey

[57] ABSTRACT

A process for high pressure oxidation of silicon comprising the steps of inserting silicon wafers and an oxidizing substance into a quartz capsule sealing the quartz capsule gas-tightly by fusing, and heating the quartz capsule to generate a high pressure oxidizing atmosphere therein and to form an oxide film on the silicon wafers without a flow of the oxidizing atmosphere. In a case where water is used as the oxidizing substance, the water is frozen and the inside space of the quartz capsule is exhausted before the sealing operation. Furthermore, in a case where an oxidizing gas, e.g. oxygen gas, is used as the oxidizing substance, if the pressure of the gas is higher than the ambient pressure, the quartz capsule is cooled to decrease the gas pressure to a pressure below the ambient pressure before the sealing operation.

16 Claims, 9 Drawing Figures

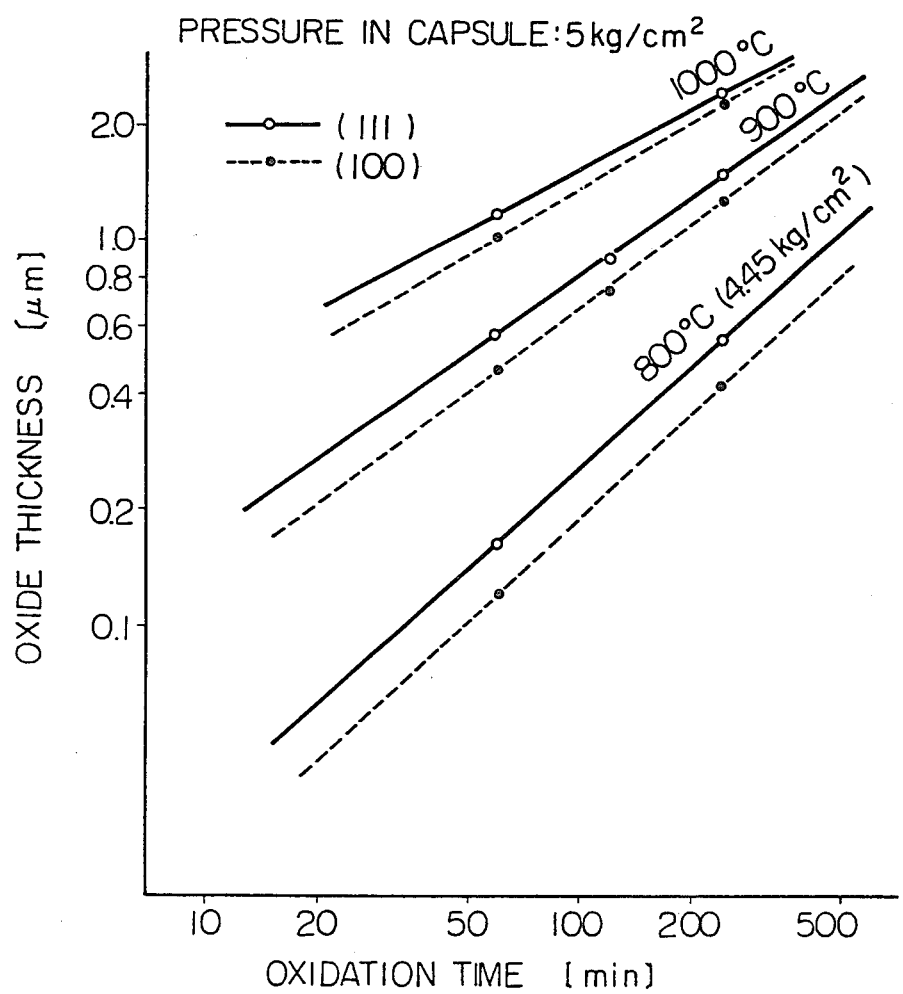

PROCESS FOR HIGH PRESSURE OXIDATION OF SILICON

This is a division, of application Ser. No. 955,755, filed Oct. 30, 1978.

BACKGROUND OF THE INVENTION

1. Field of the Invention

The present invention relates to the production of a silicon semiconductor device, and more particularly to a process for high pressure oxidation of silicon.

2. Description of the Prior Art

When a silicon semiconductor device is produced, it is necessary to form an oxide film (i.e. $SiO_2$ layer) on a silicon wafer by applying a thermal oxidation process. In a conventional thermal oxidation process the silicon wafer is heated at a high temperature of from 900° to 1200° C., for many hours, in an oxidizing atmosphere, e.g. steam, at ambient pressure. However, when the oxide film is formed by this conventional process, defects of cambers and/or strains arise in the wafer. Such defects arise easily in the large wafers which are frequently used.

In order to eliminate the above-mentioned defects, therefore, a high pressure oxidation process has been proposed. In the high pressure oxidation process the oxidation of a silicon wafer is carried out in a high pressure oxidizing medium, e.g. steam, at a relatively low temperature of from 600° to 1000° C. The features of the high pressure oxidation process are that the oxidizing rate is very rapid, the oxidation of silicon is carried out at a relatively low temperature and the quality of the formed oxide film is better than that of the conventional thermal oxidation process.

In order to carry out the high pressure oxidation process, various methods and apparatuses have been proposed. It was previously known to carry out the high pressure oxidation of silicon in a sealed bomb at a temperature of from 500° to 850° C. and a pressure of from 25 to 500 atm, as mentioned in the reports "Oxidation of Silicon by High-Pressure Steam", by Joseph R. Ligenza, J. Electrochemical Soc., vol. 109, no. 2, pp. 73–76, 1962, and "Selective Oxidation of Silicon in Low-Temperature High-Pressure Steam", by R. J. Powell et al, IEEE Trans. Electron Devices, vol. ED-21, pp. 636–640, October 1974. In this case the bomb is made of Inconel X and the interior thereof is lined with gold. One silicon wafer and a calibrated amount of water are placed inside the gold liner, which is compressed and sealed at the edges by the bomb with bolt joints. The bomb is placed in a furnace (500° to 850° C.) and steam pressure (25 to 500 atm) is generated from the water. However, this method has a very serious limitation, in that it is difficult for the bomb to accommodate a large number of silicon wafers.

One experiment with high pressure oxidation schemes was disclosed in the report "Low Temperature Thermal Oxidation of Silicon by Dry Oxygen Pressure above 1 atm", by R. J. Zeto, C. G. Thornton, E. Hryckowian, and C. D. Bosco, J. Electrochem. Soc., vol. 122, no. 10, October 1975, pp. 1409–1410. However, the pressure of the dry oxygen was so high that it would be difficult to construct an industrial apparatus utilizing such pressure.

A high pressure oxidation system is also known from a report of Bell Telephone Laboratories Inc., entitled "High Pressure Steam Apparatus for the Accelerated Oxidation of Silicon", by P. T. Panousis and M. Schneider, Abstract No. 53, of E.C.S. Spring Meeting (E.C.S., New Jersey, 1973), pp. 137–139. The system is of the continuous flow type and uses an adjustable pressure regulator to set the pressure. Operationally, steam is generated in a stainless steel water boiler and piped to a large stainless steel pressure chamber which contains an internal furnace. Silicon wafers are held in a quartz cylinder which is arranged in the furnace. This system is operated at a temperature up to 1200° C. and at a pressure up to 10 atoms. However, the steam comes into contact with the metal of the boiler and chamber, so that there is the possibility of contamination of the wafer with metal ions from the metal. Furthermore, the steam flow influences the uniformity of the thickness of an oxide film grown on the wafers. If the wafers are arranged, standing on edge, at intervals of 2 mm, the uniformity is from ±20 to ±30%. Therefore, it is necessary to arrange the wafers at intervals of from 10 to 20 mm and, thus, it is difficult to carry out the oxidation of a large number of silicon wafers at one time.

Another known high pressure oxidation system is referred to as the "high pressure pyrogenic oxidation system". This system is disclosed in the report entitled "Oxidation of Silicon in High Pressure Steam", by M. Tsubouchi, H. Miyoshi, A. Nishimoto and H. Abe, Japan Journal of Applied Physics, Vol. 16 (1977), No. 5, pp. 855–856. This system comprises mainly an outer stainless steel chamber, a internal furnace set into the inside of the chamber, and a quartz tube set in the furnace and holding silicon wafers therein. Two gas-feeders of $H_2+O_2$ and $N_2$, which generate steam by $H_2/O_2$ reaction, are connected to the inlet of the quartz tube. This system is operated at a temperature of up to 1200° C. and a pressure of up to 9 kg/cm$^2$. In this system, in order to avoid contamination of the wafers with impurities coming from the chamber and furnace, the inside pressure of the quartz tube is always controlled to be higher than the pressure in the outer stainless steel pressure chamber. However, the construction of the system is complex, and the control of the inside and outside pressure of the quartz tube and of the flow quantity of $H_2$, $O_2$ and $N_2$ is complicated. Furthermore, since there is steam flowing in the quartz tube, the uniformity of the thickness of a grown oxide film and the distance between the wafers are similar to those in the above-mentioned flow type system.

SUMMARY OF THE INVENTION

It is an object of the present invention to provide a process of high pressure oxidation of silicon which can be easily carried out with a simple apparatus.

It is another object of the present invention to provide an oxide film (i.e. an $SiO_2$ layer) to be formed on silicon wafers which has a uniform thickness and is free from contamination.

It is still another object of the present invention to provide a process for high pressure oxidation of silicon which can effect the oxidation of a large number of silicon wafers at one time.

It is further another object of the present invention to provide a process for high pressure oxidation of silicon, which allows the use of a quartz capsule with a thin wall by suitably balancing the outside pressure and the inside pressure of the quartz capsule.

According to the present invention, there is provided a process for high pressure oxidation of silicon which comprises the steps of: inserting a quartz vessel containing a predetermined amount of water into a quartz capsule in the form of a tube with one end closed; spacing silicon wafers apart from each other in said quartz capsule; evacuating said quartz capsule; sealing said quartz capsule gas-tightly by fusing; and heating said quartz capsule to an elevated temperature to generate a high pressure steam therein and to form an oxide film on said silicon wafers. Hereinafter, this process is referred to as the first process.

According to the present invention, there is also provided a process for high pressure oxidation of silicon, hereinafter referred to as the second process, which comprises the steps of: spacing silicon wafers apart from each other in a quartz capsule in the form of a tube with one end closed; feeding an oxidizing gas into the quartz capsule at a predetermined pressure; sealing the quartz capsule gas-tightly by fusing; and heating the capsule to an elevated temperature to generate a high pressure oxidizing atmosphere therein and to form an oxide film on the silicon wafers.

According to the present invention, there is also provided a process for high pressure oxidation of silicon, hereinafter referred to as the third process, which comprises the steps of: introducing silicon wafers and a predetermined amount of an oxidizing substance into a quartz capsule in the form of a tube with one end closed; sealing the quartz capsule gas-tightly by fusing; introducing the sealed quartz capsule into a furnace placed in a pressure chamber; heating the sealed quartz capsule to an elevated temperature to generate a high pressure oxidizing atmosphere therein and to form an oxide film on the silicon wafers; and, simultaneously with the heating operation, increasing the pressure in the pressure chamber.

The above-mentioned and other objects of the present invention will become more apparent from the detailed description and examples which follow.

BRIEF DESCRIPTION OF THE DRAWINGS

FIG. 7 is a diagram showing the relationship between oxide film thickness and oxidation time at 5 kg/cm² in the capsule;

DETAILED DESCRIPTION OF THE PREFERRED EMBODIMENTS

The basic concept of the first process of the present invention is the high pressure steam oxidation of silicon, which is carried out by sealing gas-tightly an evacuated quartz capsule containing silicon wafers and water, and then, by heating the sealed quartz capsule to generate a high pressure steam therein.

Figure 1:
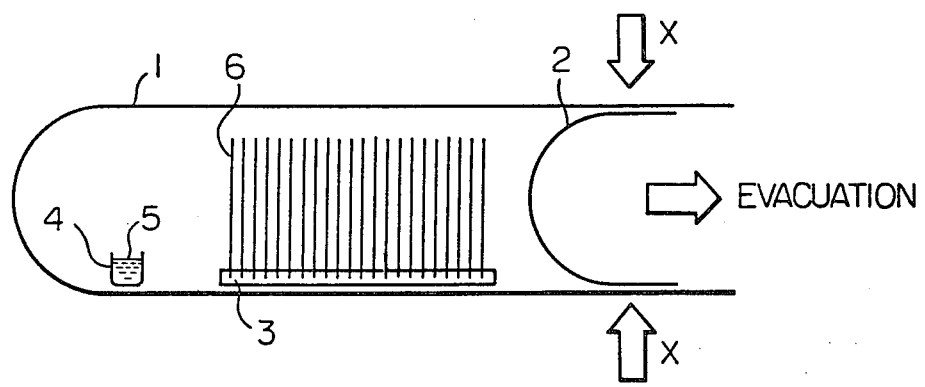
FIG. 1 is a schematic sectional view of a quartz capsule containing silicon wafers and water.

Referring to FIG. 1, a quartz vessel 4 containing a predetermined amount of water 5 and silicon wafers 6, held on a wafer holder 3 made of quartz, are arranged in a quartz capsule 1 in the form of a tube with one end closed. The quartz capsule 1 is evacuated and, then, sealed gas-tightly by fusing. In the case of FIG. 1, the sealing operation is carried out by inserting a quartz plug 2 into the quartz capsule 1 to a predetermined position, and by fusing the quartz capsule 1 and the quartz plug 2 at a point X, around the entire circumference of the quartz capsule 1, with a flame, preferably an oxyhydrogen flame. The quartz plug 2 has a slightly smaller diameter than that of the quartz capsule 1. The quartz capsule 1 is, then, heated to a predetermined temperature to generate a high pressure steam, and thus, an oxide film is formed on the surfaces of the silicon wafers 6.

Figure 2:
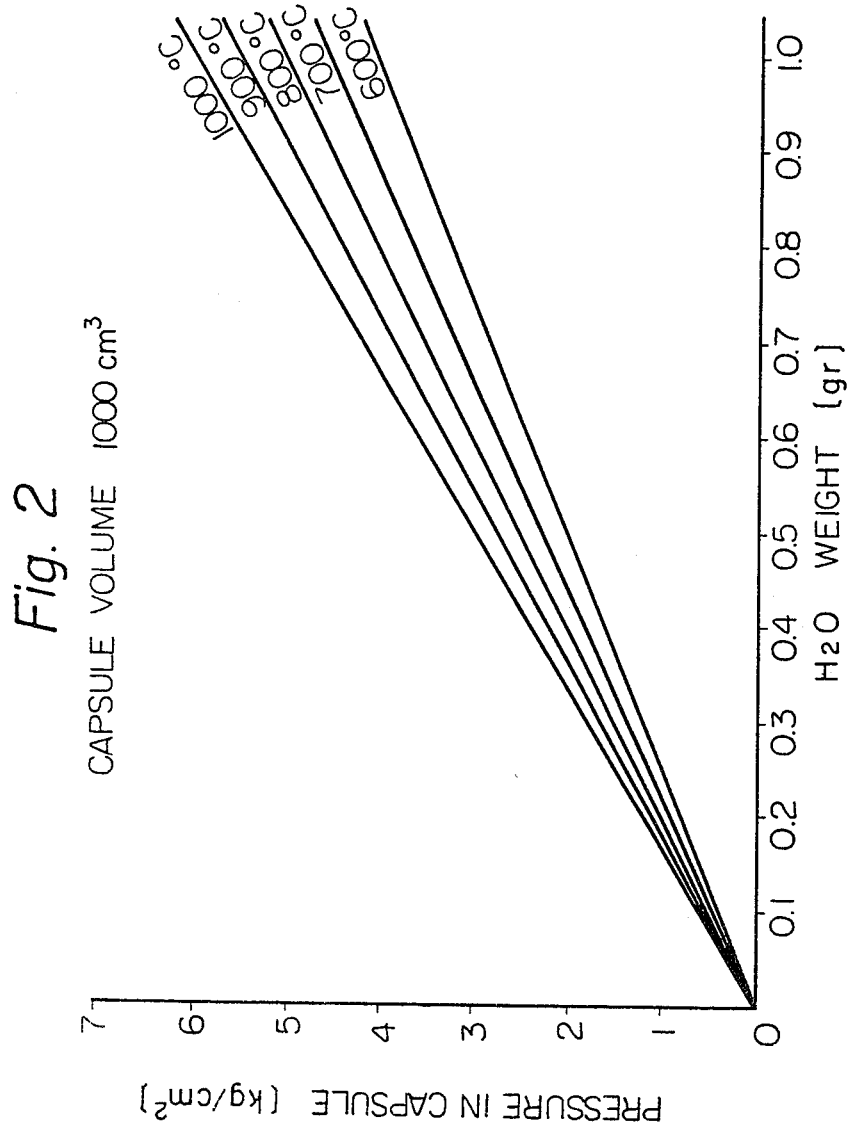
FIG. 2 is a diagram showing the relationship between pressure in the quartz capsule and the quantity of water at temperatures of 600°, 700°, 800°, 900° and 1000° C.

In the first process of the invention, the generated pressure in the quartz capsule depends upon the quantity of the enclosed water and the heating temperature. The pressure can be calculated from the following formula:

$$P = \frac{273 + T}{273} \times \frac{W}{18} \times 22.4 \times 1.033 \, [\text{kg/cm}^2]$$

wherein T is the heating temperature [°C.] and W is the quantity of water [g], with the proviso that the volume of the quartz capsule is 1000 cm³. FIG. 2 is a diagram showing the relationship between pressure in the capsule and the quantity of water at temperatures of 600°, 700°, 800°, 900° and 1000° C. according to the above formula.

The heating temperature is from 500° to 1200° C., preferably from 800° to 1000° C., and the pressure in the quartz capsule is from more than 1 to 20 kg/cm², preferably from 3 to 8 kg/cm².

The evacuating operation is carried out to obtain a pressure of from 5 to 20 Torr in the quartz capsule. The evacuating operation removes the gas remaining in the quartz capsule, which changes the oxidation rate and has a bad influence upon the oxide film properties, so that it is possible to form a good quality oxide film.

It is convenient to replace the gas remaining in the quartz capsule with a dry nitrogen gas before the vessel inserting operation, since the dry nitrogen gas removes moisture from the quartz capsule.

The water, preferably distilled water, contained in the quartz capsule should be frozen before the evacuating operation in order to prevent boiling of the water. Boiling of the water occurs when the quartz capsule is evacuated to a lower pressure than the vapor pressure of water which is, for example, 17.53 mmHg at 20° C. and 4.58 mmHg at 0° C. Boiling of the water splashes a part of the water from the vessel onto the silicon wafers and if any is evacuated this changes the charged amount of the water. Therefore, it is preferable to cool the quartz capsule with a cooling agent, for example, a liquid nitrogen, to freeze the water.

It is possible to use a hydrochloric acid containing water instead of plain water, so that a high pressure HCl oxidation of silicon can be carried out. The preferable concentration of hydrochloric acid is from 0.1 to 10 mol %.

The basic concept of the second process of the invention is a high pressure dry oxidation of silicon, which is carried out by sealing gas-tightly a quartz capsule containing silicon wafers and an oxidizing gas, and then, by heating the sealed quartz capsule to generate a high pressure oxidizing atmosphere therein.

Figure 3:
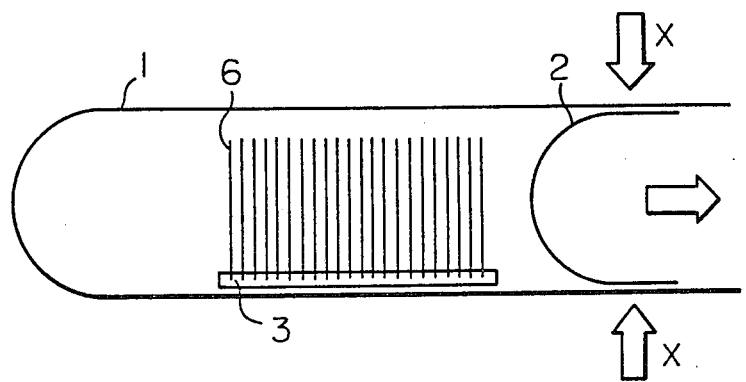
FIG. 3 is a schematic sectional view of a quartz capsule containing silicon wafers.

Referring to FIG. 3, silicon wafers 6, held on a wafer holder 3 made of quartz, are arranged in a quartz capsule 1 in the form of a tube with one end closed. An oxidizing gas is fed into the quartz capsule 1 and, then, the capsule 1 is gas-tightly sealed by fusing. In the case of FIG. 3, the sealing operation is carried out by inserting a quartz plug into the capsule 1 to a predetermined position, and by fusing the quartz capsule 1 and plug 2 at a point X around the entire circumference of the capsule 1 with a flame, preferably a oxyhydrogen flame, in the same manner as mentioned with regard to the first process. The quartz plug 2 has a slightly smaller diameter than that of the quartz capsule 1. The quartz capsule 1 is, then, heated to a predetermined temperature to generate a high pressure oxidizing atmosphere, and thus, an oxide film is formed on the surfaces of the silicon wafers 6.

It is convenient to evacuate the quartz capsule before the feeding operation. This is because this operation removes the remaining gas in the quartz capsule which, if not removed changes the oxidizing rate and has a bad influence upon the oxide film properties.

In the second process the oxidizing gas is a gas used in a conventional flow-type thermal oxidation process and is a member selected from the group consisting of oxygen, nitrogen monoxide, nitrogen dioxide and carbon dioxide.

The pressure of the fed oxidizing gas is determined according to the oxidation pressure to be generated in the quartz capsule and the heating temperature. Namely, if the pressure of the oxidizing gas is, for example, 1 atm and 2 atm at 20° C., the oxidation pressure is 4 atm and 8 atm, respectively, at 900° C. Especially, if the pressure of the fed oxidizing gas (i.e. the pressure in the quartz capsule) is above an ambient pressure (1 atm), it is necessary to decrease the pressure below the ambient pressure before the fusing operation. Therefore, in order to decrease the pressure it is preferable to cool the quartz capsule with a cooling agent, for example, liquid nitrogen.

By adding a hydrochloric acid gas or a chlorine gas in an amount of from 0.1 to 10 vol % into the oxidizing gas, it is possible to carry out a high pressure HCl or $Cl_2$ oxidation of silicon.

The second process of the present invention is useful for forming a gate oxide film in a semiconductor device, e.g. MOS device. A gate oxide film with a thickness, for example of 500 Å, can be formed at a low temperature, for example of 900° C., at an oxidation pressure, for example of 3.3 kg/cm², in a short period of time, for example 120 minutes, by the second process. Such oxidation conditions cause no warping of a silicon wafer and decrease the harmful influences upon the crystal structure of the silicon wafer. Especially, in the case of the oxidation of a silicon wafer which already had a diffused layer sensitive to temperature, the second process is very useful.

In the case where the high pressure oxidation is carried out using the first or second process of the present invention, the mechanical strength of the quartz capsule becomes a problem. From experiments carried out by the inventor it was found that a quartz capsule having a wall thickness of 2.5 mm and a diameter of 66 mm can withstand a generated pressure of 10 kg/cm², at 1000° C. In addition, it was found that a quartz capsule (for 3 inch wafers) having a wall thickness of 3.5 mm and a diameter of 93 mm can withstand the generated pressure of 10 kg/cm², at 1000° C. However, it is necessary to carry out the fusing operation of the quartz capsule and plug carefully. Since stress must not occur in the quartz capsule and the quartz plug after the fusing operation, it is important to anneal the fused portion with a burner, e.g. a ring burner. Furthermore, it is preferable that the difference between diameters of the capsule and plug be less than 1 mm. The stress generated in the fused portion can be investigated by using a polarized light.

The basic concept of the third process of the present invention is a high pressure oxidation of silicon, which is carried out by arranging in a pressure chamber a sealed quartz capsule holding silicon wafers and an oxidizing substance, and then, by applying a pressure to the outside of the quartz capsule during the oxidation. In the third process the oxidation is carried out by balancing the outside pressure and the inside pressure of the quartz capsule, so that stress generated in the quartz capsule decreases and the oxidation is carried out safely.

Figure 4:
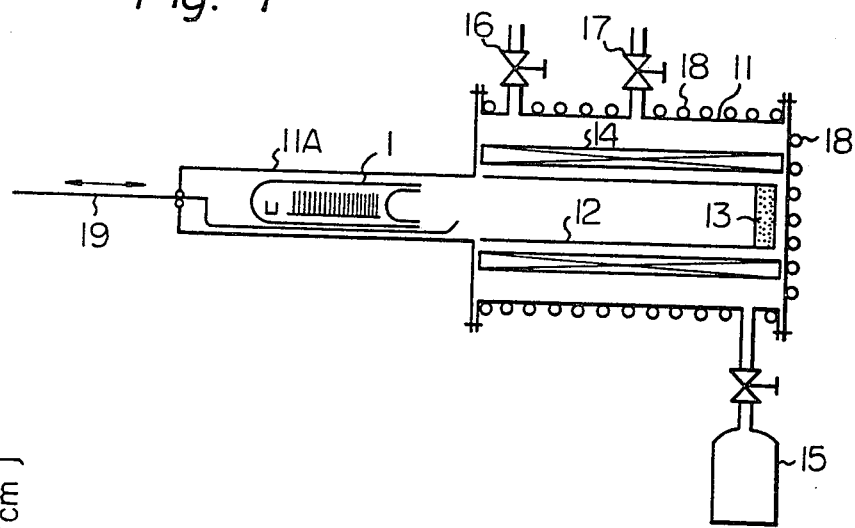
FIG. 4 is a schematic sectional view of a high pressure oxidation apparatus having a pressure chamber, a furnace and a quartz capsule.

The third process of the present invention will now be explained with reference to FIG. 4, which is a schematic sectional view of an apparatus for executing the third process. Referring to the FIG. 4, a high pressure oxidation apparatus consists of a pressure chamber 11, a furnace 14 arranged in the pressure chamber 11 and a quartz capsule 1 to be inserted into the furnace 14. The pressure chamber 11 is provided with a loader portion 11A, a loader rod 19, a pressure control valve 16, a safety valve 17 and cooling pipes 18. The inside space of the pressure chamber 11 is connected to a pressure gas source 15, e.g. a nitrogen gas bomb. The furnace 14 is provided with a tube 12 for uniform heating and a heat insulating material 13.

Silicon wafers and an oxidizing substance are introduced into the quartz capsule 1 and, then, the quartz capsule 1 is gas-tightly sealed by fusing. The sealed quartz capsule 1 is arranged in the loader portion 11A and inserted into the tube 12 inside of the furnace 14 by the loader rod 19. The furnace 14 heats the capsule 1 and, simultaneously, the pressure of the gas from the source 15 which is applied to the outside of the capsule 1 is increased.

For example, in a case where the generated pressure in the quartz capsule reaches 10 kg/cm², if the pressure in the pressure chamber (i.e. the pressure of the fed nitrogen gas) is set at 5 kg/cm², the pressure applied on the outside of the quartz capsule is 5 kg/cm² before heating and, then, when 10 kg/cm² is generated in the capsule at the oxidizing temperature the pressure applied on the inside of the capsule is 5 kg/cm². In this regard, although a quartz capsule has a diameter of 66 mm and a wall thickness of only 2 mm, a high pressure of 10 kg/cm² can be generated in the quartz capsule safely. In this case the outside pressure on the capsule, i.e. the pressure in the pressure chamber, is constant so that the structure of the necessary pressure control system is simple.

Furthermore, the pressure in the pressure chamber is increased or decreased proportionately to increases and decreases of the heating temperature of the furnace so that the stress generated in the quartz capsule is minimized. Therefore, when the inside and outside pressures are maintained in equilibrium during the oxidation, it is possible to safely use a quartz capsule having a mechanical strength of only 2 kg/cm$^2$ for a 10 kg/cm$^2$ oxidation. As a result, a cheap quartz capsule with a thin wall can be used for the high pressure oxidation of silicon. Furthermore, the third process becomes a very useful method for large size wafer oxidation.

In the third process the oxidizing substance enclosed in the capsule is water or an oxidizing gas selected from the group consisting of oxygen, nitrogen monoxide, nitrogen dioxide and carbon dioxide. It is preferable to add HCl into the water and to add HCl gas or Cl$_2$ gas into the oxidizing gas.

In a case where water is used as the oxidizing substance, the procedure before the sealing operation comprises the steps of: inserting a predetermined amount of the water into the quartz capsule; arranging silicon wafers in the quartz capsule; freezing the water; and, evacuating the quartz capsule, as has been stated with regard to the first process of the present invention. The pressure to be generated in the quartz capsule depends upon the quantity of the enclosed water and the heating temperature as has also been stated. It is preferable to carry out the high pressure steam oxidation at a temperature of from 500° to 1200° C. and a generated pressure of from more than 1 to 20 kg/cm$^2$ in the capsule.

In a case where an oxidizing gas, i.e. oxygen, nitrogen monoxide, nitrogen dioxide or carbon dioxide, is used as the oxidizing substance, the procedure before the sealing operation comprises the steps of: arranging silicon wafers in the quartz capsule, and feeding the oxidizing gas into the quartz capsule, as has been stated with regard to the second process of the present invention. If the oxidizing gas has a higher pressure than ambient pressure, it is necessary to cool the quartz capsule with a cooling agent, for example, a liquid nitrogen, before the sealing operation, as has also been stated. It is preferable to carry out the high pressure dry oxidation at a temperature of from 500° to 1200° C. and a generated pressure of from more than 1 to 15 kg/cm$^2$ in the capsule.

In the first through third processes of the present invention, it is convenient to arrange the silicon wafers, standing on edge, at intervals of from 2 to 10 mm. Thus, it is possible to oxidize a large number of silicon wafers at one time.

As is clear from the above explanation, since all the portions, i.e. capsule, plug, wafer holder and vessel, facing the silicon wafers are made of quartz, the oxidation process of the present invention is a clean process, namely, the oxidation can be carried out free of contamination. Therefore, the silicon wafers are not contaminated.

Furthermore, since there is no flow of an oxidizing atmosphere in the quartz capsule, the uniformity of the thickness of an oxide film formed on the silicon wafers is better than ±2% across a wafer and from wafer to wafer, and, it is possible to accommodate a large number of silicon wafers in one quartz capsule. The wafers are arranged, standing on edge, at intervals of from 2 to 10 mm, or by placing one above another with a required gap therebetween.

The following examples are included merely as an aid to the understanding of the invention, and variations may be made by one skilled in the art without departing the spirit and scope of the invention.

EXAMPLE 1

The air in the quartz capsule was completely replaced with a dry nitrogen gas. A quartz vessel was filled with 0.9 g of distilled water and, then, the quartz vessel was inserted into a quartz capsule in the form of a tube with one end closed. The quartz capsule had a diameter of 66 mm and a wall thickness of 2.5 mm. 50 silicon wafers, which were of the 1 ohm-cm n-type oriented in the (111) direction, in the form of circular slices about 5 cm in diameter, were arranged on a quartz wafer holder, standing on edge, at intervals of 2 mm. The wafers were, then, inserted into the quartz capsule.

Thereafter, a quartz plug with a diameter of 60 mm was inserted into the quartz capsule and placed at the predetermined position so as to define an inside space of 1000 cm$^3$ in the quartz capsule. A part of the quartz capsule was cooled with a liquid nitrogen to freeze the water in the vessel.

The nitrogen was exhausted from the capsule until the pressure in the capsule reached 20 Torr. Then the circumference of the capsule was heated at the position of the quartz plug with an oxyhydrogen flame to fuse the capsule and plug gas-tightly.

Thereafter, the sealed capsule was inserted into a furnace as used for diffusing a dopant, which was maintained at 900° C., and was heated for 1 hour. As a result, a pressure of about 5 kg/cm$^2$ was generated in the quartz capsule. An oxide film (SiO$_2$ layer) with a thickness of 5700 Å was formed on the silicon wafers by the above mentioned process. When the same heating operation was carried out for 4 hours, an oxide film with a thickness of 15000 Å was obtained. The uniformity of the thickness of the formed oxide film was ±2% across a wafer and from wafer to wafer.

EXAMPLE 2

Figure 5:
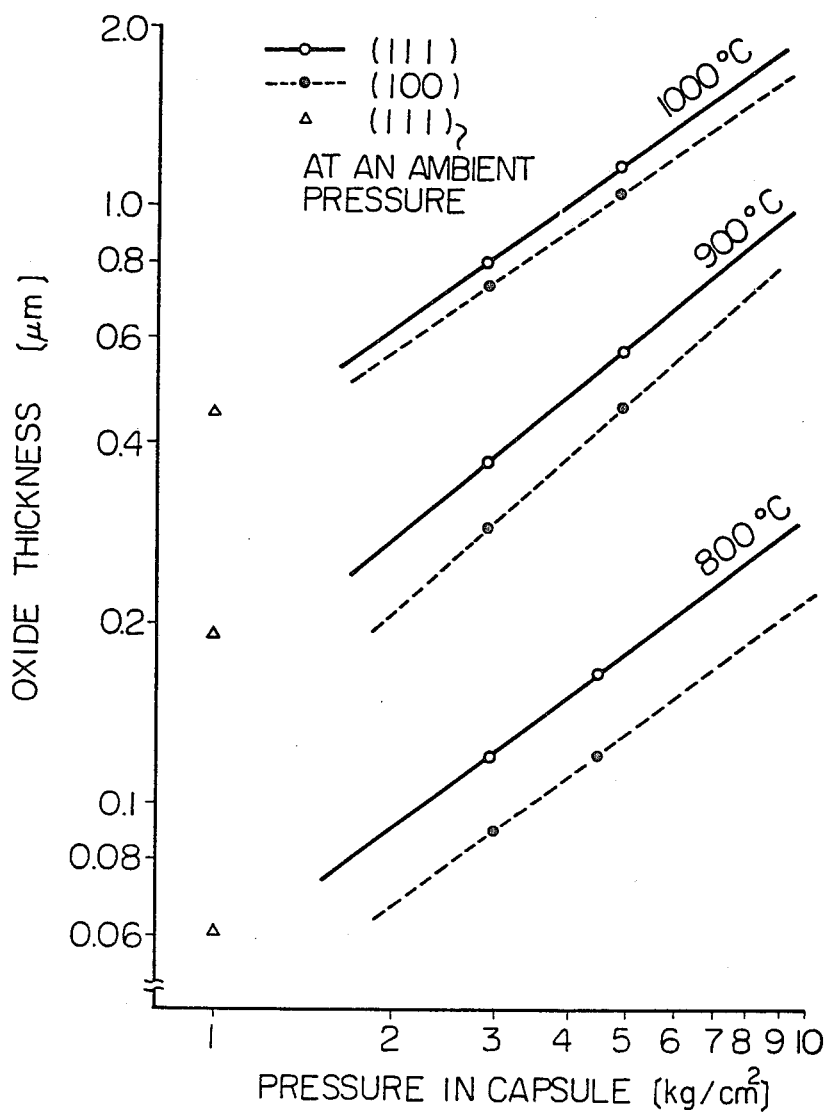
FIG. 5 is a diagram showing the relationship between oxide film thickness and pressure in the capsule.

Silicon wafers used in this example were of the 1 ohm-cm n-type oriented in the (111) direction and of the 4 ohm-cm n-type oriented the (100) direction. These wafers were oxidized under the same conditions as those described in Example 1, except that the quantity of the distilled water and the heating temperature (i.e. the oxidation temperature) were varied. For example, by referring to FIG. 2, it will be seen that in order to generate a pressure of 5 kg/cm$^2$ in the capsule at a temperature of 1000° C., the quantity of the enclosed water should be about 0.83 g. Experiments concerning the oxidation were carried out to obtain the results shown in FIG. 5, which is a diagram showing the relationship between oxide film thickness and pressure in the capsule at 800°, 900° and 1000° C. for 1 hour. In FIG. 5 a solid line and a broken line represent the (111) wafer and the (100) wafer, respectively. The symbol Δ represents the results of reference experiments which were carried out in a steam flow-type oxidation process by feeding steam at 100° C. in a conventional way.

EXAMPLE 3

Figure 6:
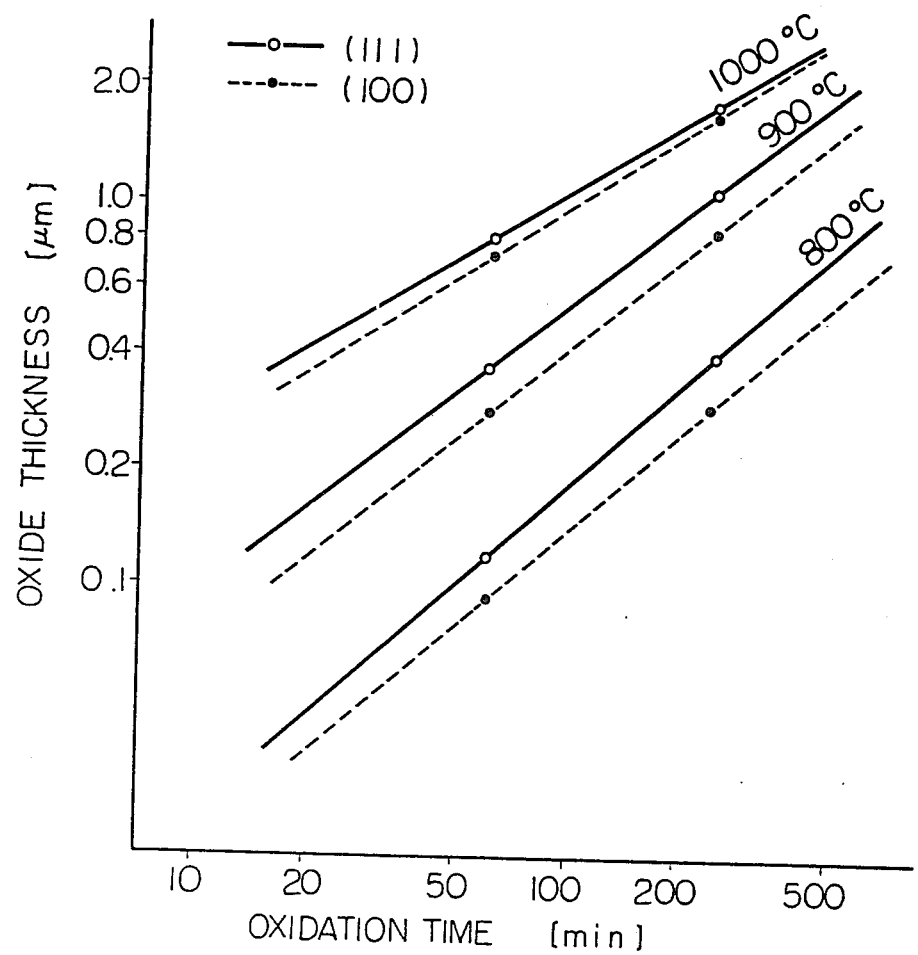
FIG. 6 is a diagram showing the relationship between oxide film thickness and oxidation time at 3 kg/cm² in the capsule.

In this example a pressure of 3 kg/cm$^2$ in the quartz capsule at 800°, 900° and 1000° C. was generated and maintained. The rest of the oxidation conditions were the same as those of Example 2. The obtained results are shown in FIG. 6, which is a diagram showing the relationship between oxide film thickness and oxidation time.

EXAMPLE 4

In this example a pressure of 5 kg/cm² in the quartz capsule at 900° and 1000° C. and a pressure of 4.45 kg/cm² at 800° C. were generated and maintained. The rest of the oxidation conditions were the same as those of Example 2. The obtained results are shown in FIG. 7, which is a diagram showing the relationship between oxide film thickness and oxidation time.

EXAMPLE 5

In this example in order to compare the nature of the oxide films formed by the process of the present invention and by a conventional steam flow type oxidation process the breakdown of the electric field [V/cm] of the oxide films formed under the following oxidation conditions was measured.

Figure 8:
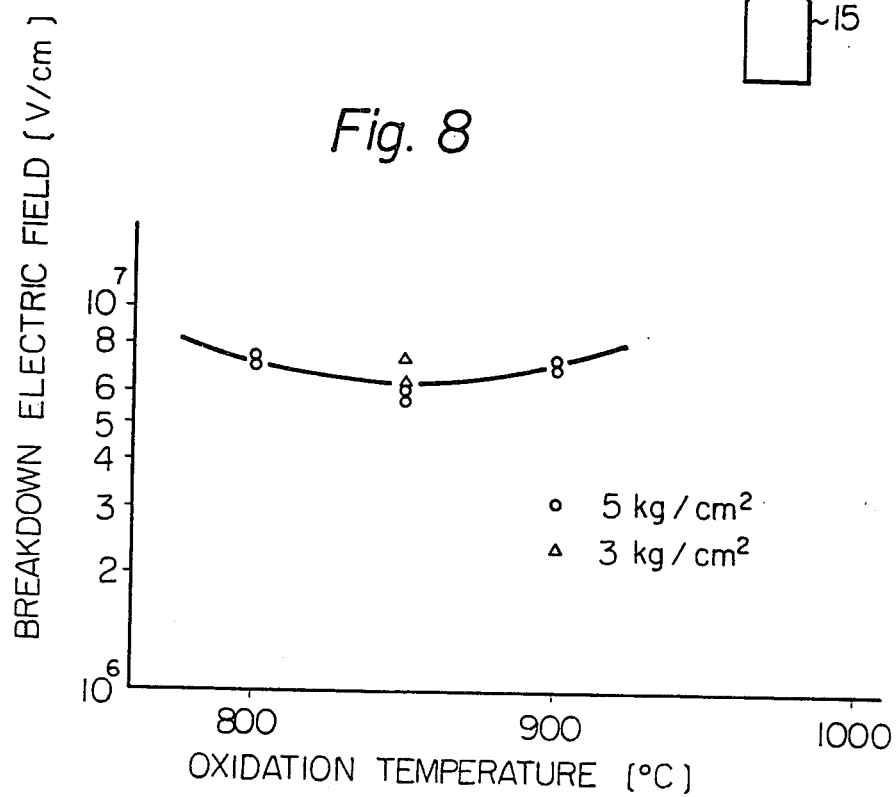
FIG. 8 is a diagram showing the relationship between a breakdown electric field and oxidation temperature.

Silicon wafers used in this example were of the 8 ohm-cm p-type oriented in the (100) direction. The silicon wafers were oxidized at a steam pressure of 5 kg/cm² in the capsule at a heating temperature of 800°, 850° and 900° C. (shown by the symbol o in FIG. 8), and at a pressure of 3 kg/cm² and a heating temperature of 850° C. (shown by the symbol Δ in FIG. 8), according to the process of the present invention.

On the other hand, the same silicon wafer was oxidized by feeding a moisture-containing oxygen gas, as a carrier gas, into a quartz tube which was arranged in furnace maintained at 900° C. The carrier gas was made by contacting a dry oxygen gas with water boiled under an ambient pressure (1 atm). The resultant oxide film had a breakdown electric field of about 7 MV/cm (not shown in FIG. 8). Therefore, the breakdown electric field values of the oxide films formed by the process of the present invention and by the flow-type oxidation process were almost the same.

EXAMPLE 6

Silicon wafers used in this example were of the 1 ohm-cm n-type oriented in the (111) direction, in the form of circular slices about 5 cm in diameter. The 50 silicon wafers were arranged, standing on edge, at intervals of 2 mm, on a quartz wafer holder and, then, inserted into a quartz capsule. The quartz capsule had a diameter of 66 mm and a wall thickness of 2.5 mm. A quartz plug with a diameter of 60 mm was, then, inserted into the quartz capsule and placed at the predetermined position so as to define an inside space of 1000 cm³ in the quartz capsule.

The air was exhausted from the capsule and the capsule was filled with an oxygen gas having an ambient pressure. The circumference of the quartz capsule was heated at the position of the quartz plug with an oxyhydrogen flame to fuse the quartz capsule and plug gas-tightly. Therefore, the sealed capsule was inserted into a furnace, maintained at 900° C., and heated for 1 hour. As a result, a pressure of about 4.2 atm was generated in the capsule and an oxide film (SiO₂ layer) of a thickness of about 1000 Å was formed on the silicon wafers.

EXAMPLE 7

Silicon wafers in the form of circular slices about 5 cm in diameter and 1 g of distilled water were inserted into a quartz capsule having a diameter of 66 cm and a wall thickness of 2 mm. The quartz capsule was gas-tightly sealed in the same manner as described in Example 1.

Figure 9:
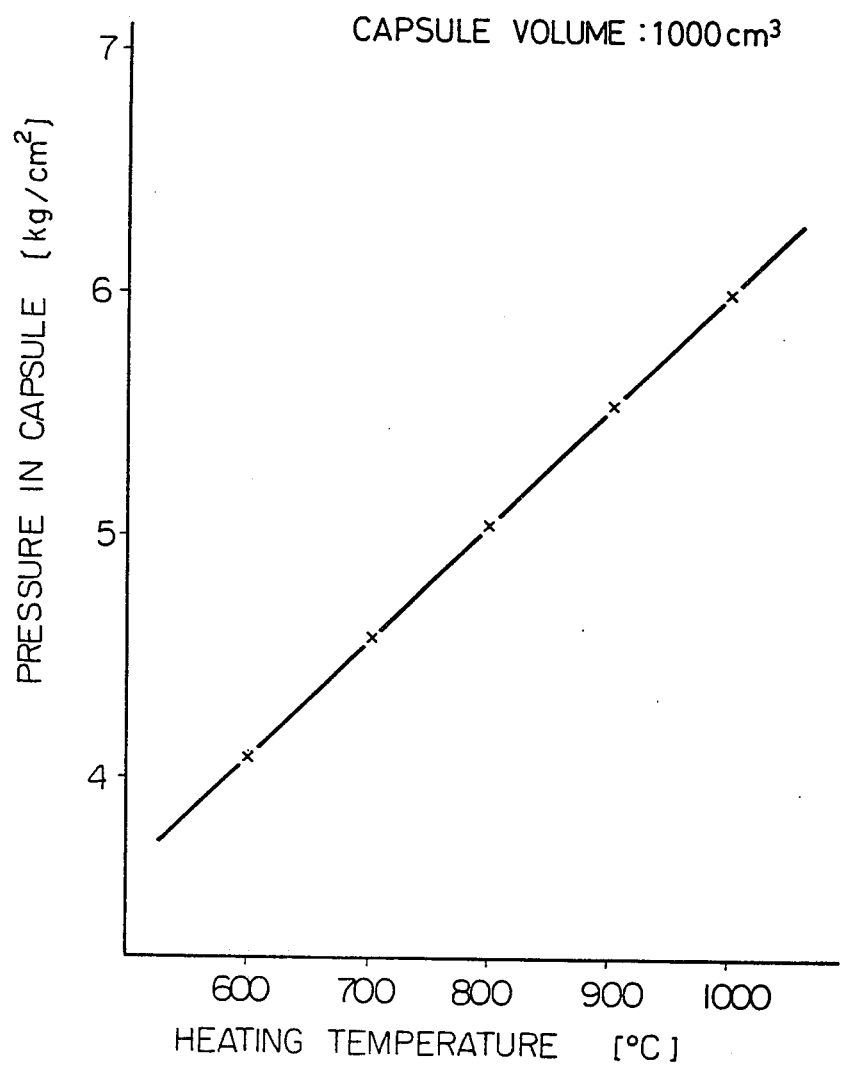
FIG. 9 is a diagram showing the relationship between pressure in the capsule and heating temperature when the capsule contains 1 g of water.

A 6 kg/cm² (at 1000° C.) oxidation of the silicon wafers was carried out. Firstly, the pressure in the pressure chamber was adjusted to become 2 kg/cm², and then, the sealed capsule was inserted into a furnace which was arranged in the pressure chamber and maintained at 575° C. The capsule was heated, so that the pressure in the capsule was raised to 4 kg/cm² gradually. When the 4 kg/cm² pressure was generated in the capsule, the pressure in the chamber (i.e. the pressure applied to the outside of the capsule) was increased to 4 kg/cm². The pressure in the chamber was increased to 4.6, 5.1, 5.5 and 6.0 kg/cm² as the furnace temperature raised to 700°, 800°, 900° and 1000° C., respectively, in accordance with the line in FIG. 9. The quartz capsule did not break.

From Example 7, it is obvious that a quartz capsule with a thin wall can be used for high pressure oxidation in the present invention process.

What is claimed is:

1. A process for high pressure oxidation of silicon with high uniformity in the thickness of the oxide film, said process comprising the steps of:
   spacing silicon wafers apart from each other in a quartz capsule in the form of a tube with one end closed;
   feeding a predetermined pressure of an oxidizing gas into said quartz capsule;
   sealing said quartz capsule gas-tightly by fusing; and
   heating said quartz capsule to an elevated temperature to generate a high pressure oxidizing atmosphere therein and to form said high uniformity oxide film on said silicon wafers.

2. A process according to claim 1 said oxidizing gas comprising a gas selected from the group consisting of oxygen, nitrogen monoxide, nitrogen dioxide and carbon dioxide.

3. A process according to claim 2 comprising adding a gas selected from the group consisting of hydrochloric acid gas and a chlorine gas of from 0.1 to 10 vol % into said oxidizing gas.

4. The process of claim 2, said oxidizing gas comprising dry oxygen gas.

5. A process according to claim 1 comprising evacuating said quartz capsule before said feeding step.

6. A process according to claim 1, said sealing operation comprising the steps of inserting a quartz plug into said quartz capsule and fusing said quartz capsule and plug gas-tightly by a flame.

7. A process according to claim 6, said feeding step resulting in said oxidizing gas having higher than ambient pressure in said capsule, said process comprising the step of cooling said oxidizing gas with a cooling agent before said sealing step.

8. The process of claim 7, said cooling agent comprising liquid nitrogen.

9. The process of claim 6, said flame comprising an oxyhydrogen flame.

10. A process according to claim 1 wherein said elevated temperature is from 500° to 1200° C. and said generated pressure is from 1 to 15 kg/cm².

11. The process of claim 10, said heating step comprising heating to a temperature from 800° to 1000° C.

12. The process of claim 10 or 11, said heating step comprising generating said pressure from 2 to 10 kg/cm².

13. A process according to claim 1 said heating step comprising forming said oxide film to form a gate oxide film of an MOS semiconductor device.

14. A process according to claim 1 said spacing step comprising standing said silicon wafers on edge on a quartz holder at intervals of from 2 to 10 mm.

15. The process of claim 1 comprising forming said oxide on said wafers to have said uniformity in thickness of at least ±2%.

16. The process of claim 1 comprising placing at least 50 of said wafers in said quartz capsule at intervals in the range from 2 to 10 mm, and forming said oxide on said wafers to have said uniformity in thickness of at least ±2%.

* * * * *

UNITED STATES PATENT AND TRADEMARK OFFICE
CERTIFICATE OF CORRECTION

PATENT NO. : 4,293,589
DATED : October 6, 1981
INVENTOR(S) : MIKIO TAKAGI et al.

It is certified that error appears in the above—identified patent and that said Letters Patent is hereby corrected as shown below:

Front page: [75] Inventors, "Mikio Takagi; Mamoru Maeda, both of Kawasaki;" should be --Mikio Takagi, Kawasaki; Mamoru Maeda, Tama;--;
    [56] References Cited, Other Publications:
Tsubouchi N. et al., "High Pres-" should be --High-Pres---;
Chamberlin et al., "using" should be --Using--;
Zeto et al., "1ATM" should be --1 Atm--;
Powell, "Ed.-21" should be --ED-21--.

Col. 1, lines 19, 40, and 52, "C." should be --C--.
Col. 2, lines 10 and 35, "C." should be --C--;
    line 11, "atoms" should be --atms--;
    line 29, "a" should be --an--;
    line 51, "of" (list occurrence) should be --for--.
Col. 3, line 44, "C." should be --C--;
    line 46, a new paragraph should be begun with "Fig. 4";
    line 59, "," should be --;--;
    line 60, delete ";".
Col. 4, lines 31, 36, 38, 39 and 57, "C." should be --C--.
Col. 5, line 16, "a" (2nd occurrence) should be --an--;
    lines 38 and 55, "C." should be --C--;
    line 48, "vol" should be --vol.--;
    line 61, "had" should be --has--.

UNITED STATES PATENT AND TRADEMARK OFFICE
CERTIFICATE OF CORRECTION

PATENT NO. : 4,293,589

DATED : October 6, 1981

Page 2 of 2

INVENTOR(S) : MIKIO TAKAGI et al.

It is certified that error appears in the above—identified patent and that said Letters Patent is hereby corrected as shown below:

Col. 7, lines 25 and 40, "C." should be --C--.
Col. 8, lines 10, 40 and 54, "111" should not be in heavy type;
lines 28, 48, 53, 58 and 63 "C." should be --C--;
line 41, after "oriented" insert --in--;
lines 41 and 55, "100" should not be in heavy type.
Col. 9, lines 4, 5, 22, 24 and 57, "C." should be --C--;
line 15, after "process" insert --,--;
line 19, "100" should not be in heavy type;
line 40, "111" should not be in heavy type.
Col. 10, lines 1, 13 and 59, "C." should be --C--.

Signed and Sealed this

Twenty-third Day of February 1982

[SEAL]

Attest:

GERALD J. MOSSINGHOFF

Attesting Officer

Commissioner of Patents and Trademarks